US006905891B2

(12) United States Patent
Kovar et al.

(10) Patent No.: US 6,905,891 B2
(45) Date of Patent: Jun. 14, 2005

(54) METHOD FOR PROCESSING MULTIPLE SEMICONDUCTOR DEVICES FOR TEST

(75) Inventors: Gary J. Kovar, Austin, TX (US); Patrick B. Cochran, Dripping Springs, TX (US); Tim V. Pham, Austin, TX (US)

(73) Assignee: Frrescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/085,694

(22) Filed: Feb. 28, 2002

(65) Prior Publication Data

US 2003/0160315 A1 Aug. 28, 2003

(51) Int. Cl.[7] ............................................... H01L 21/66
(52) U.S. Cl. ........................................ 438/14; 257/655
(58) Field of Search ....................... 438/14–18; 257/655

(56) References Cited

U.S. PATENT DOCUMENTS

| 4,720,317 | A | 1/1988 | Kuroda et al. |
| 5,888,882 | A | 3/1999 | Igel et al. |
| 5,911,329 | A | 6/1999 | Wark et al. |
| 6,251,695 | B1 | * 6/2001 | Kwon ........................ 438/14 |
| 6,551,845 | B1 | * 4/2003 | Moden et al. ................ 438/15 |
| 2002/0016013 | A1 | 2/2002 | Iketani |

FOREIGN PATENT DOCUMENTS

| WO | WO 90/09093 | 8/1990 |
| WO | WO 92/14263 | 8/1992 |

OTHER PUBLICATIONS

Dictionary of Science and Technology, Academic Press, p. 2125.*

* cited by examiner

Primary Examiner—Nathan J. Flynn
Assistant Examiner—Leonardo Andujar
(74) Attorney, Agent, or Firm—Joanna G. Chiu; Kim-Marie Vo

(57) ABSTRACT

A packaged array (10) having a temporary substrate (20) is used to test a plurality of semiconductor devices (14). In one embodiment, the temporary substrate (20) is an adhesive substrate, such as tape. A support structure (18) may lie over the temporary substrate (20) or be within the temporary substrate (20). The plurality of semiconductor devices (14) lie within an array (16, 6, or 8) and may be tested in parallel. One array or a multiple number of arrays may lie on the packaged array (10).

19 Claims, 3 Drawing Sheets

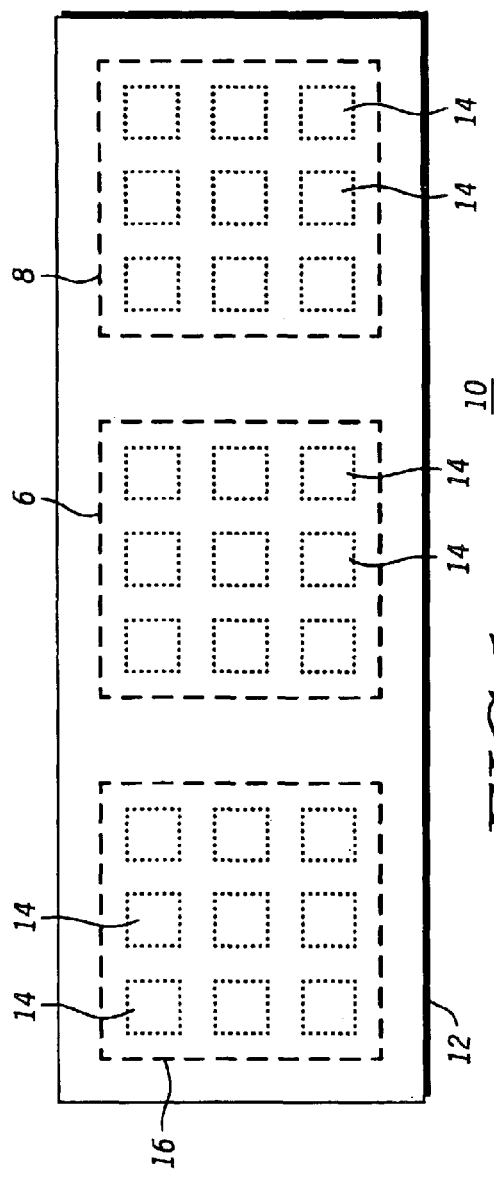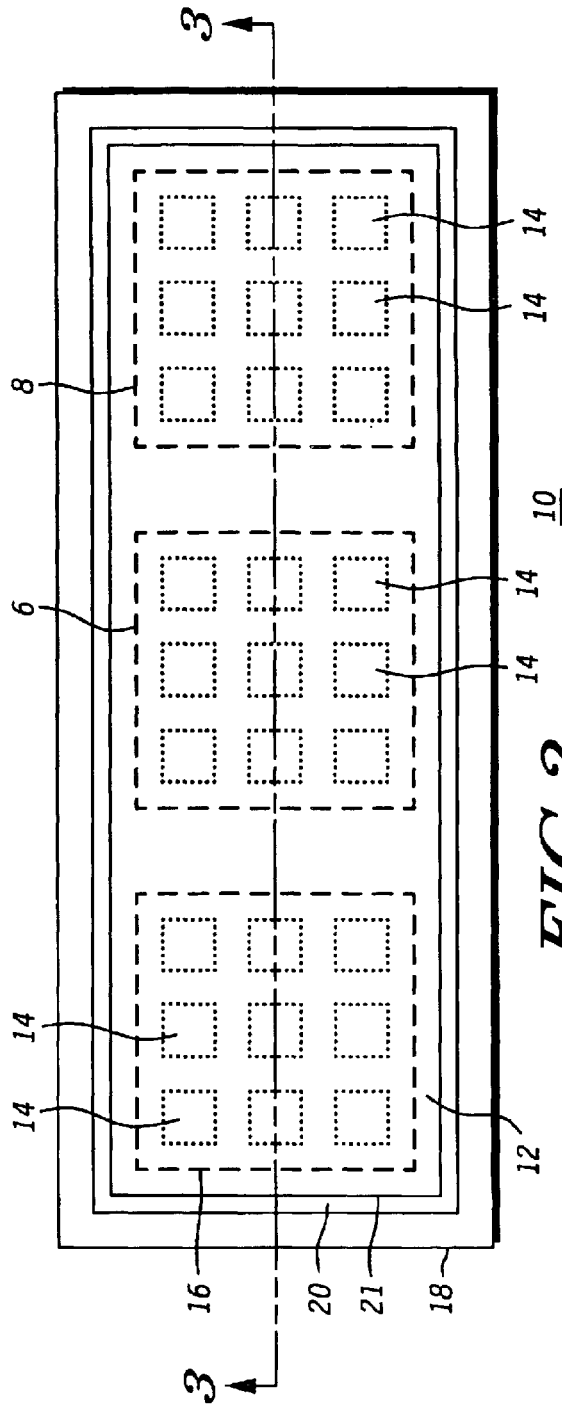

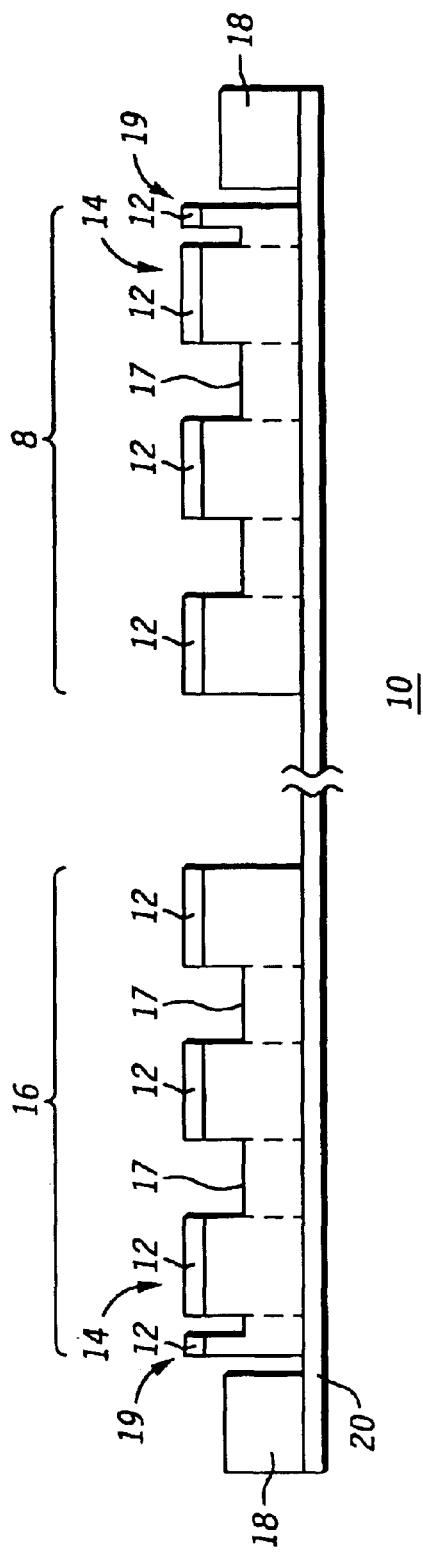
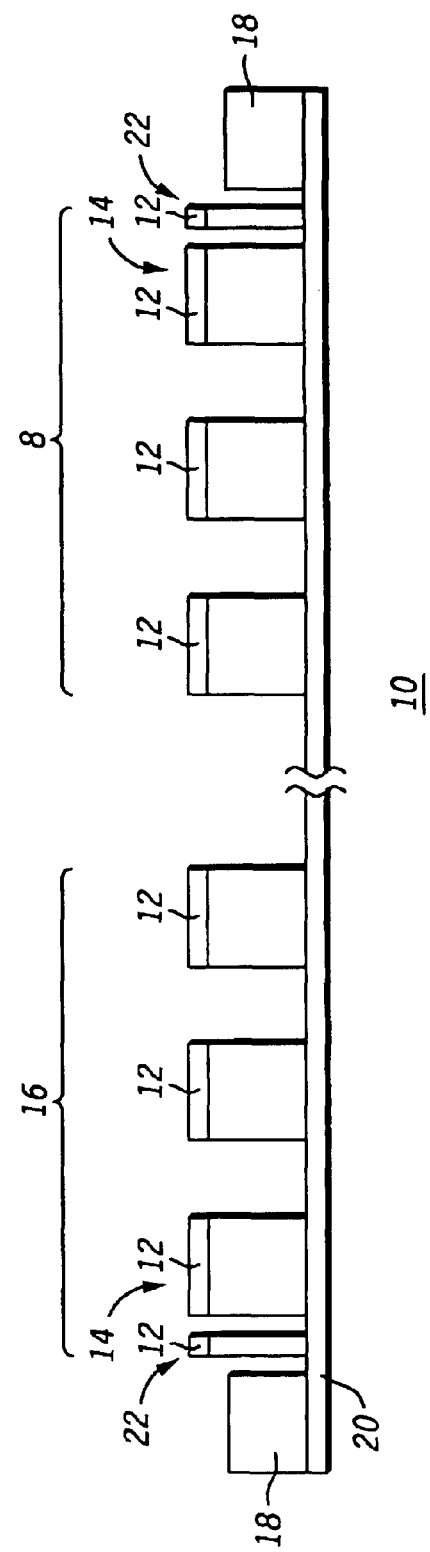

METHOD FOR PROCESSING MULTIPLE SEMICONDUCTOR DEVICES FOR TEST

FIELD OF THE INVENTION

The present invention relates generally to semiconductor device processing, and more specifically, to processing multiple semiconductor devices for test.

RELATED ART

As the semiconductor industry evolves, devices continually become smaller. This continuing evolution leads to very small packages which become increasingly difficult to handle and time consuming to test. Device package technologies have progressed from discrete packaging for individual devices to packaging many devices at one time in a single format. However, in order to perform testing of individual devices packaged together, they must be electrically isolated.

One prior art method of testing devices packaged together involves molding an array of devices. The molded arrays are then electrically isolated using a half saw method. However, the half saw method results in a brittle array for testing since the molding material is the only material holding the array of devices in place. Furthermore, the half saw method may remove any periphery material surrounding the molded array which may have contained alignment and identification information, thus increasing process time and overall cost.

Accordingly, a need exists for a method for handling and testing smaller packages which maintains physical integrity while reducing process time and cost.

BRIEF DESCRIPTION OF THE DRAWINGS

The present invention is illustrated by way of example and not limited by the accompanying figures, in which like references indicate similar elements, and in which:

FIG. 1 illustrates a bottom view of an encapsulated packaged array in accordance with one embodiment of the present invention;

FIG. 2 illustrates a bottom view of a encapsulated packaged array having a temporary adhesive substrate in accordance with one embodiment of the present invention;

FIG. 3 illustrates a cross sectional view of the encapsulated packaged array of FIG. 2, taken along line 3—3, after performing a half saw process in accordance with one embodiment of the present invention;

FIG. 4 illustrates a cross sectional view of the encapsulated packaged array of FIG. 2, taken along line 3—3, after performing a full saw process in accordance with an alternate embodiment of the present invention.

Figure 5:
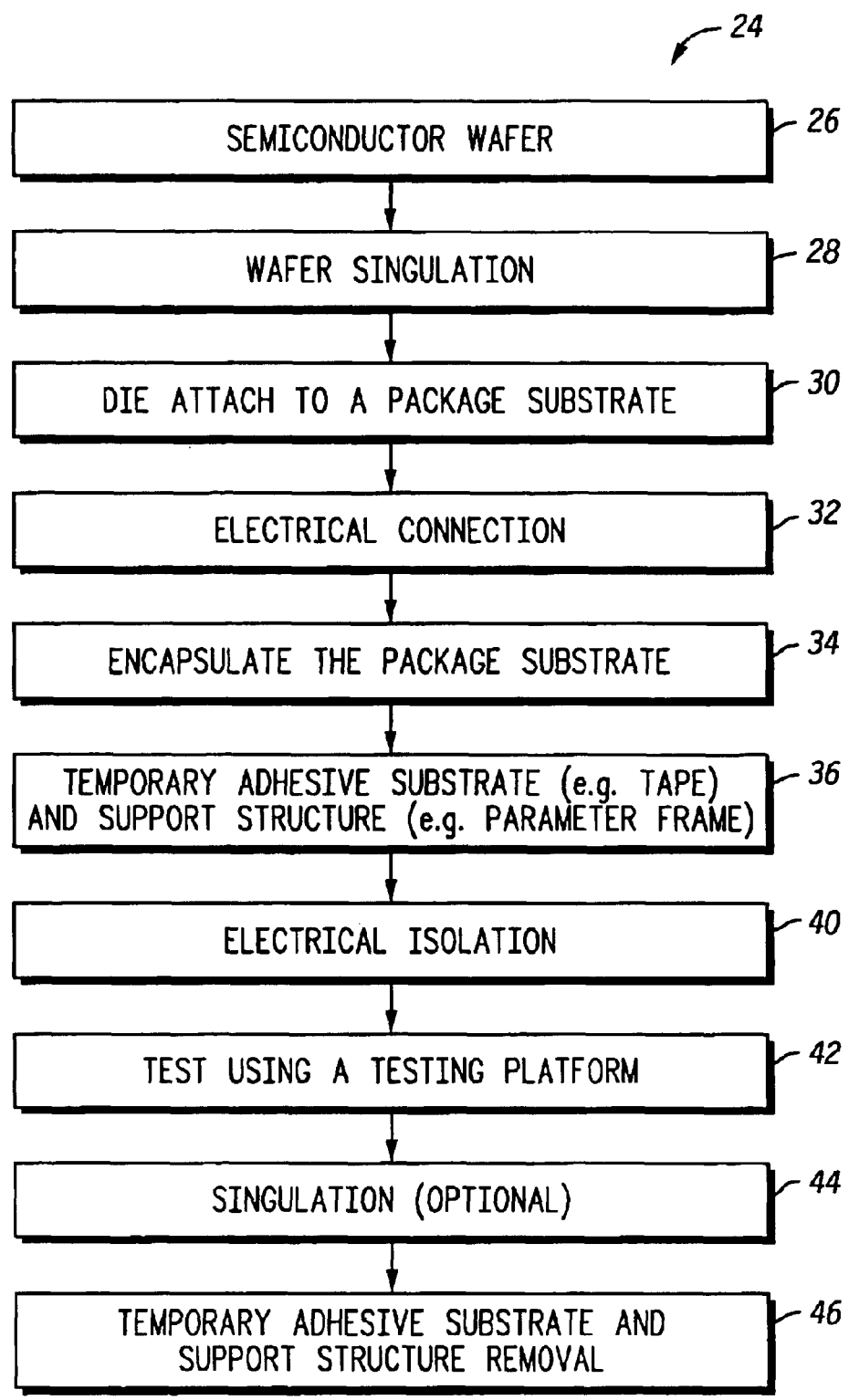
FIG. 5 illustrates a process flow in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Embodiments of the present invention allow for the electrical isolation of encapsulated packaged arrays while maintaining physical integrity of the packaged arrays for testing and transport. These encapsulated package arrays may refer to MAPBGAs (molded array package ball grid arrays), QFNs (quad flat package no leads), MLPs (molded leadless packages), other leadless packages, or the like. A temporary adhesive substrate may be used to maintain the physical integrity of electrically isolated devices that are either physically isolated or physically connected via an encapsulation layer. A support structure in addition to the temporary adhesive substrate may also be used to provide further support and to provide an area for markings, as will be discussed below. The temporary adhesive substrate therefore allows for the transport and testing of multiple devices in parallel.

FIG. 1 illustrates a bottom view of an encapsulated packaged array 10 in accordance with one embodiment of the present invention. Packaged array 10 includes a package substrate 12 and a plurality of semiconductor devices 14 (whose outlines are indicated by dotted lines since they are on the opposite side of package substrate 12 and cannot be seen from the bottom view). Package substrate 12 can be any type of substrate, such as, for example, a metal substrate (e.g. a lead frame), an organic substrate (e.g. fiber glass), or any other type of substrate. Packaged array 10 includes arrays 16, 6, and 8, wherein each array includes a same number of devices 14. (The arrays 16, 6, and 8, are indicated by dashed lines in FIGS. 1 and 2.) However, in alternate embodiments, each array may include a different number of devices, or packaged array 10 may include a single array, such as a panel array. That is, packaged array 10 may refer to any configuration having at least two semiconductor devices (such as semiconductor devices 14). The outer periphery of substrate 12 (such as the area surrounding arrays 16, 6, and 8 in FIG. 1) may include markings such as indexing, alignment fiducials, electrical contacts that may need to be preserved for testing, or any other type of markings, such as identification markings, etc. The identification markings may include a bar code, a two dimension matrix, radio frequency circuitry, etc. Package substrate 12 also includes a variety of interconnects or traces that provide for electrical connections between devices, such as devices 14, or within devices. Therefore, the devices 14 of FIG. 1 may be electrically connected to other devices (e.g. neighboring devices) within an array or across arrays.

Semiconductor devices 14 each include at least one semiconductor die (not shown) electrically connected to package substrate 12 and an encapsulation layer. (Note that the die within semiconductor devices 14 may include any type of circuitry that perform any type of function.) In one embodiment, each array 16, 6, and 8 is encapsulated individually (where, in this embodiment, the dashed lines defining arrays 16, 6, and 8 may also correspond to the outer edge of each array's encapsulation layer). Alternatively, a single encapsulation layer may be used for all devices 14 on package substrate 12 (such as, for example, in the case of a single panel array). The encapsulation can be performed by a variety of difference processes, such as, for example, plastic overmolding, conformal coating (e.g. epoxy coating), or any other encapsulation process. FIGS. 2–4 will be discussed below in combination with FIG. 5.

FIG. 5 illustrates a process flow 24 for processing multiple devices for test. In block 26, a semiconductor wafer is provided. In block 28, singulation of the semiconductor wafer is performed. The singulated die are then attached to a package substrate (in block 30) using, for example, an adhesive. As discussed in reference to FIG. 1, the package substrate can include any type of material, such as metal, organic, etc. In block 32, electrical connections are provided for the die. For example, in one embodiment, the die are wire bonded to leads on the package substrate. Alternatively, other methods may be used to provide electrical connections for the die, such as, for example, bump methods. Flow then proceeds to block 34 where the package substrate and the attached die are encapsulated, thus resulting in an encapsulated packaged array, such as packaged array 10 of FIG. 1.

Flow proceeds to block 36 where a temporary adhesive substrate and support structure are added. FIG. 2 illustrates the packaged array 10 of FIG. 1 with an additional temporary adhesive substrate 20 and support structure 18. In one embodiment, temporary adhesive substrate 20 includes an adhesive tape and support structure 18 includes a metallic frame at the periphery of the tape. The encapsulated side of the array is attached to the adhesive side of the tape such that the metallic frame provides support and positional integrity for the array. Note that the side opposite the encapsulated side is left exposed to allow for electrical contacts for test. (However, note that in alternate embodiments, a temporary adhesive substrate may be used on either side of the packaged array, or alternatively, on both sides, where the temporary adhesive substrate may cover all or portions of the packaged array.) The metallic frame may also be marked with information that may be provided to a data base for identification or other testing purposes. FIG. 2 illustrates a bottom view of packaged array 10 having a temporary adhesive substrate 20 and support structure 18 surrounding an outer edge 21 of package substrate 12. (Note that outer edge 21 may also be referred to as perimeter 21.) In this embodiment, a gap exists between outer edge 21 and support structure 18 such that temporary adhesive substrate 20 is visible. However, in alternate embodiments, outer edge 21 may be adjacent to support structure 18, or may overlap support structure 18.

Alternate embodiments may use any type of temporary adhesive substrates other than tape, and any type of support structure (such as metal, plastic, ceramic, etc.) that provides the necessary degree of support. Alternatively, temporary adhesive substrate 20 may not require a separate support structure at all. That is, support structure 18 may be optional or may be within temporary adhesive substrate 20. For example, temporary adhesive substrate 20 can be a less flexible material than tape which is still capable of providing sufficient support to packaged array 10. Also, temporary adhesive substrate 20 may include any necessary markings if no support structure is necessary. Furthermore, temporary adhesive substrate 20 can be any type of temporary substrate that can later be removed, and can be attached or fastened to the encapsulation portion of packaged array 10 using any variety of methods, such as mechanical forces, electrostatic forces, magnetic forces, etc.

Flow then proceeds to block 40 of FIG. 5 where electrical isolation of semiconductor devices 14 is performed. FIG. 3 illustrates one embodiment for electrically isolating devices 14. FIG. 3 illustrates a cross sectional view along line 3-3 of packaged array 10 after a half saw process. The half saw process electrically isolates devices 14 by severing package substrate 12 surrounding each device 14 and thus severing any electrical connections that existed within package substrate 12 between devices 14. The half saw process leaves at least a portion of the encapsulation layer 17 between devices 14 thus maintaining a physical connection between devices 14. This helps to provide positional integrity for test. If the encapsulation layer sufficiently overlaps the outer periphery of an array (such as arrays 16, 6, and 8), portions 19 of the encapsulation layer 17 may remain after the half saw process. However, in alternate embodiments, the half saw process may remove these portions 19. FIG. 4 illustrates a cross sectional view also along line 3—3 of an alternate embodiment for electrically isolating devices 14 where a full saw process is used. The full saw process eliminates any electrical and physical connections between devices 14 such that only temporary adhesive structure 20 maintains the positional integrity of devices 14. That is, package substrate 12 as well as encapsulation layer 17 are physically separated via the full saw process. If the encapsulation layer sufficiently overlaps the outer periphery of an array, portions 22 of the encapsulation layer may remain after the full saw process. Alternatively, the full saw process may remove these portions 22 as well. FIGS. 3 and 4 illustrate all electrical connections between each device 14 being severed since each device 14 is now attached to a physically isolated portion of package substrate 12. However, in alternate embodiments, only selected electrical connections may be severed. Furthermore, all or selected electrical connections may be severed between only selected devices 14. That is, any degree of electrical isolation between devices may be implemented. Also, processes other than sawing may be used to isolate the devices. For example, a laser may used to electrically isolate devices 14.

Flow proceeds to block 42 of FIG. 5 where devices 14 are tested using a testing platform. That is, the devices 14 attached to temporary adhesive structure 20 are generally placed on a testing platform, support platform, or chuck for testing. (Therefore, temporary adhesive structure 20 is generally a separate portion or substrate from the testing platform; however, in an alternate embodiment, temporary adhesive structure 20 may be an integrated portion of the testing platform.) The tests performed on devices 14 may include thermal tests (e.g. thermal conditioning), environmental tests, electrical tests, functional tests, physical tests, etc. The positional integrity of the electrically isolated devices 14 provided by temporary adhesive substrate 20 allows the testing of devices 14 to be performed in parallel. Temporary adhesive substrate 20 also allows for the transport of multiple electrically isolated devices simultaneously while maintaining positional integrity of devices 14. Furthermore, test results or any other information may be correlated to the corresponding semiconductor device or array through the use of markings on the temporary adhesive substrate 20 or support structure 18.

Flow then proceeds to an optional singulation step 44. For example, if a full saw process was used in step 40, singulation step 44 would not be necessary because the die are already physically separate from each other. However, if a half saw process was used in step 40, singulation step 44 is performed to fully singulate the semiconductor devices. Therefore, if further singulation is necessary, step 44 can be included in the flow.

After testing and optional singulation, flow proceeds to block 46 where temporary adhesive substrate 20 and support structure 18 are removed. After removal of temporary adhesive substrate 20, semiconductor devices 14 may optionally be sorted based on test results. Alternatively, temporary adhesive substrate 20 and support structure 18 (if any) may be removed during sorting. Note that after the temporary adhesive substrate (and support structure, if any) are removed, the temporary adhesive substrate and support structure can be reused for further packaged array processing.

In an alternate embodiment to the flow of FIG. 5, the package substrate may be optional. That is, after wafer singulation in step 28, the singulated die may be encapsulated without the use of a package substrate. For example, the singulated die may be placed in a holder or carrier structure for positional integrity during encapsulation. The resulting array, held together by the encapsulation, would then proceed to step 36 where a temporary adhesive substrate and support structure are added. (In this embodiment, the resulting array may be transported with or without the holder or carrier structure.) Also, note that, as discussed above, the support structure may not be needed depending on the type of temporary adhesive substrate used. Since no package substrate exists in this embodiment, step 40 would no longer be necessary and flow would proceed to test block 42. After test 42, flow proceeds to singulate step 44 in order to fully singulate the semiconductor devices, and subsequently, to temporary adhesive substrate removal step 46.

Alternatively, after wafer singulation step 28, the singulated die may be individually encapsulated and placed within a holder or carrier structure for maintaining positional integrity. Flow would then proceed to step 36 where a temporary adhesive substrate (and, if necessary, a support structure) would be added. In yet another embodiment, the individually encapsulated singulated die may be attached directly to a temporary adhesive substrate. In these embodiments, after the addition of the temporary adhesive substrate, flow would proceed to test 42 and temporary adhesive substrate removal 46. Note that singulation step 44 would not be necessary since the devices are already physically isolated.

In an alternate embodiment, the temporary adhesive substrate may be used to perform Known Good Die testing. For example, in this embodiment, after wafer singulation 28, flow proceeds to step 36 where the singulated die are attached to the temporary adhesive substrate. That is, the semiconductor die are not packaged (i.e. encapsulated) prior to testing (at step 40). Therefore, the testing at step 40 may be used to identify which semiconductor die have circuitry that properly perform predetermined operations (as may be defined by a predetermined specification). In this embodiment, after wafer singulation, a "pick and place" tool may be used to place the semiconductor die onto the temporary adhesive substrate. (Note that in alternate embodiments, the wafer prior to singulation may be placed on the temporary adhesive substrate for testing.)

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for testing a plurality of semiconductor die, wherein the method comprises:
   providing a semiconductor wafer having a plurality of semiconductor die;
   singulating the semiconductor wafer;
   placing the plurality of semiconductor die directly on a temporary adhesive substrate;
   placing the plurality of semiconductor die with the temporary adhesive substrate on a testing platform;
   testing in parallel at least two of the plurality of semiconductor die; and
   removing the temporary adhesive substrate after testing.

2. The method of claim 1, further comprising:
   attaching the plurality of semiconductor die to a package substrate; and
   electrically connecting at least one of the plurality of semiconductor die to the package substrate.

3. The method of claim 1, wherein singulating comprises electrically isolating the plurality of semiconductor die.

4. The method of claim 3, further comprising singulating the plurality of semiconductor die to physically separate at least two semiconductor die of the plurality of semiconductor die from each other.

5. The method of claim 1, further comprising providing a support structure in contact with the temporary adhesive substrate.

6. The method of claim 1, further comprising sorting the plurality of semiconductor die, wherein removing the temporary adhesive substrate is performed while sorting the plurality of semiconductor die.

7. The method of claim 1, further comprising forming an array using the plurality of semiconductor die prior to placing the plurality of semiconductor die on the temporary adhesive substrate.

8. The method of claim 1, wherein placing the plurality of semiconductor die on the temporary adhesive substrate forms an array.

9. The method of claim 1, wherein singulating the semiconductor wafer is performed prior to placing the plurality of semiconductor die directly on the temporary adhesive substrate, wherein placing the plurality of semiconductor die directly on the temporary adhesive substrate comprises:
   placing the plurality of singulated semiconductor die directly on the temporary adhesive substrate.

10. The method of claim 1, wherein singulating the semiconductor wafer is performed after placing the plurality of semiconductor die directly on the temporary adhesive substrate, wherein placing the plurality of semiconductor die directly on the temporary adhesive substrate comprises:
    placing the semiconductor wafer directly on the temporary adhesive substrate.

11. The method of claim 10, wherein singulating the semiconductor wafer is performed using a partial saw process.

12. The method of claim 10, wherein singulating is performed while the semiconductor wafer is directly on the temporary adhesive substrate.

13. A method for testing a plurality of semiconductor die, wherein the method comprises:
    providing a plurality of semiconductor die;
    encapsulating the plurality of semiconductor die to form an array, wherein the array has a perimeter;
    placing the array on a temporary substrate;
    electrically isolating the plurality of semiconductor die in the array using a partial saw process, the partial saw process leaving at least a portion of the encapsulation between at least two of the plurality of semiconductor devices;

placing the array with the temporary substrate on a testing platform;

testing at least one of the plurality of semiconductor die in the array while the array is on the temporary substrate and the testing platform; and removing the temporary substrate.

14. The method of claim 13, wherein testing at least one of the plurality of semiconductor die in the array further comprises testing in parallel at least two of the plurality of the semiconductor die.

15. The method of claim 13, further comprising:

attaching the plurality of semiconductor die to a package substrate; and electrically connecting at least one of the plurality of semiconductor die to the package substrate.

16. The method of claim 13, wherein electrically isolating is performed by using one of a saw and a laser.

17. The method of claim 13, further comprising, after testing, fully singulating the plurality of semiconductor die in the array to physically separate at least two semiconductor die of the plurality of semiconductor die from each other.

18. The method of claim 17, wherein singulating is performed by sawing.

19. The method of claim 13, wherein the temporary substrate is a temporary adhesive substrate.

* * * * *

UNITED STATES PATENT AND TRADEMARK OFFICE
CERTIFICATE OF CORRECTION

PATENT NO. : 6,905,891 B2  Page 1 of 1
APPLICATION NO. : 10/085694
DATED : February 28, 2002
INVENTOR(S) : Gary J. Kovar It is certified that error appears in the above-identified patent and that said Letters Patent is hereby corrected as shown below:

Title page, Item (73) Assignee:

Change "Frrescale" to --Freescale--.

Signed and Sealed this

Seventh Day of November, 2006

JON W. DUDAS
*Director of the United States Patent and Trademark Office*

UNITED STATES PATENT AND TRADEMARK OFFICE
CERTIFICATE OF CORRECTION

PATENT NO. : 6,905,891 B2
APPLICATION NO. : 10/085694
DATED : June 14, 2005
INVENTOR(S) : Gary J. Kovar It is certified that error appears in the above-identified patent and that said Letters Patent is hereby corrected as shown below:

Title page, Item (73) Assignee:

Change "Frrescale" to --Freescale--.

This certificate supersedes Certificate of Correction issued November 7, 2006.

Signed and Sealed this

Twelfth Day of December, 2006

JON W. DUDAS
*Director of the United States Patent and Trademark Office*